(12) United States Patent
Gothoskar et al.

(10) Patent No.: US 11,762,159 B2
(45) Date of Patent: Sep. 19, 2023

(54) EVANESCENT COUPLING OF PHOTODIODE WITH OPTICAL WAVEGUIDE

(71) Applicant: Cisco Technology, Inc., San Jose, CA (US)

(72) Inventors: Prakash B. Gothoskar, Allentown, PA (US); Vipulkumar K. Patel, Breinigsville, PA (US); Soha Namnabat, Breinigsville, PA (US); Ravi S. Tummidi, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 12 days.

(21) Appl. No.: 17/302,854

(22) Filed: May 13, 2021

(65) Prior Publication Data
US 2021/0278615 A1 Sep. 9, 2021

Related U.S. Application Data

(62) Division of application No. 16/698,458, filed on Nov. 27, 2019, now Pat. No. 11,067,765.

(51) Int. Cl.
| | |
|---|---|
| *G02B 6/12* | (2006.01) |
| *G02B 6/30* | (2006.01) |
| *G02B 6/42* | (2006.01) |
| *H01L 31/0232* | (2014.01) |
| *H01L 31/0352* | (2006.01) |
| *H01L 31/105* | (2006.01) |
| *G02B 6/122* | (2006.01) |

(52) U.S. Cl.
CPC ....... *G02B 6/4298* (2013.01); *G02B 6/12004* (2013.01); *G02B 6/305* (2013.01); *G02B 6/4203* (2013.01); *H01L 31/02327* (2013.01); *H01L 31/03529* (2013.01); *H01L 31/1055* (2013.01); *G02B 6/1228* (2013.01); *G02B 2006/12123* (2013.01)

(58) Field of Classification Search
CPC .. G02B 6/12004; G02B 6/1228; G02B 6/305; G02B 6/4203; G02B 6/4298; G02B 2006/12123; H01L 31/02327; H01L 31/03529; H01L 31/1055
See application file for complete search history.

(56) References Cited

U.S. PATENT DOCUMENTS

| | | | | |
|---|---|---|---|---|
| 6,819,839 B2* | 11/2004 | Zheng | ...................... | G02B 6/42 257/431 |
| 6,856,733 B2* | 2/2005 | Zheng | ...................... | G02B 6/42 385/39 |
| 6,991,892 B2* | 1/2006 | Block | ................ | G02B 6/12004 257/432 |
| 7,397,101 B1* | 7/2008 | Masini | ................. | G02B 6/4295 257/656 |
| 8,290,325 B2* | 10/2012 | Reshotko | ............ | H01L 31/1085 385/129 |

(Continued)

*Primary Examiner* — Ryan A Lepisto
(74) *Attorney, Agent, or Firm* — Patterson + Sheridan, LLP

(57) ABSTRACT

Embodiments described herein include an apparatus comprising a semiconductor-based photodiode disposed on a semiconductor layer, and an optical waveguide spaced apart from the semiconductor layer and evanescently coupled with a depletion region of the photodiode. The photodiode may be arranged as a vertical photodiode or a lateral photodiode.

18 Claims, 8 Drawing Sheets

(56) References Cited

U.S. PATENT DOCUMENTS

| | | | | |
|---|---|---|---|---|
| 8,410,420 B1* | 4/2013 | Hochberg | ............ | G01J 1/0209 |
| | | | | 385/40 |
| 8,853,812 B2* | 10/2014 | Okamoto | ............ | H01L 31/105 |
| | | | | 438/69 |
| 8,861,909 B2* | 10/2014 | Lipson | ................ | H01L 31/182 |
| | | | | 438/57 |
| 9,588,298 B2* | 3/2017 | Novack | ................ | G02B 6/125 |
| 2018/0301570 A1* | 10/2018 | Hassan | ............... | H01L 31/1808 |

* cited by examiner

EVANESCENT COUPLING OF PHOTODIODE WITH OPTICAL WAVEGUIDE

CROSS-REFERENCE TO RELATED APPLICATIONS

This application is a divisional of co-pending U.S. patent application Ser. No. 16/698,458, filed Nov. 27, 2019. The aforementioned related patent application is herein incorporated by reference in its entirety.

TECHNICAL FIELD

Embodiments presented in this disclosure generally relate to semiconductor-based optical devices.

BACKGROUND

Silicon-on-insulator (SOI) optical devices may include waveguides, optical modulators, detectors, CMOS circuitry, metal leads for interfacing with external semiconductor chips, and the like. Although crystalline silicon is excellent at forming waveguides with submicron dimensions, silicon tends to be a poor material for both generating and absorbing light at wavelengths used for optical communication. While III-V semiconductors may be better suited as photodetectors, these materials tend to be expensive and their fabrication techniques tend to be less compatible with Si fabrication processes.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
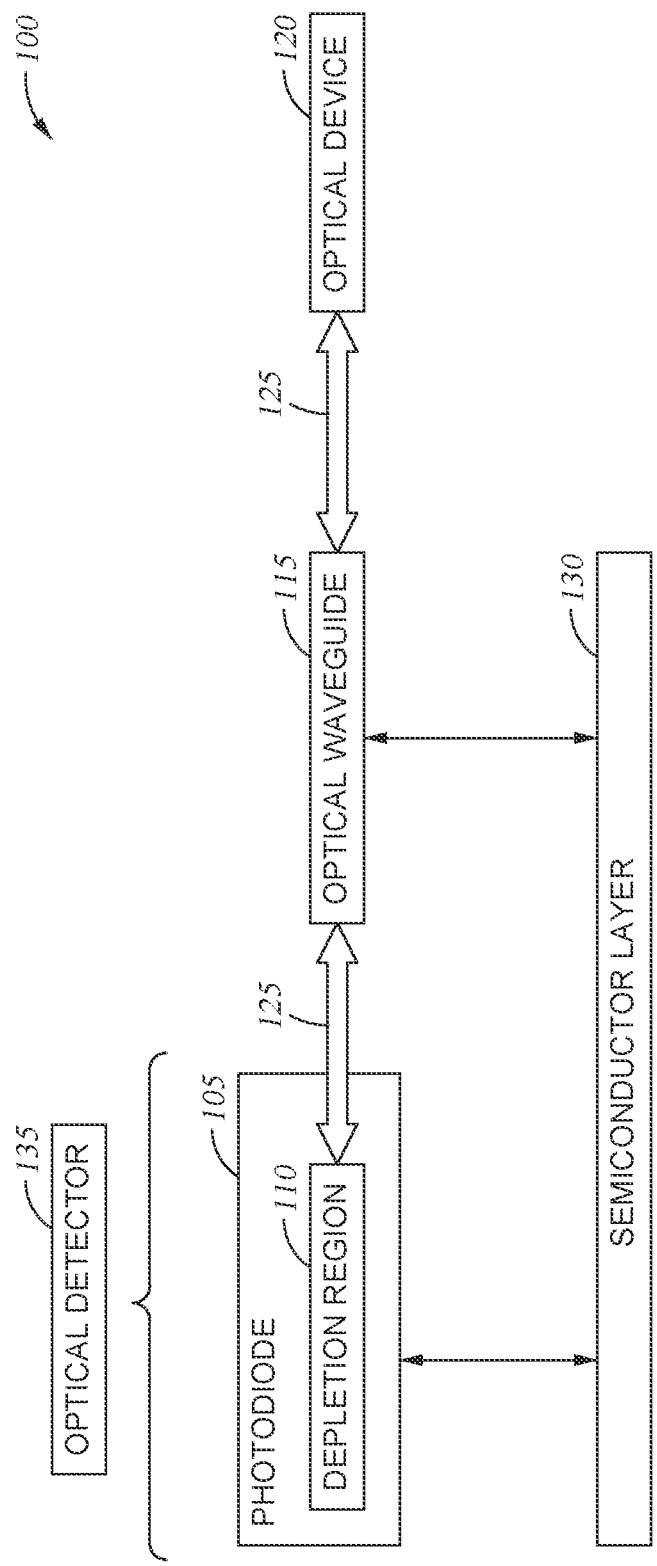
FIG. 1 is a block diagram of an exemplary apparatus, according to one or more embodiments.

One embodiment presented in this disclosure is an apparatus comprising a semiconductor-based photodiode disposed on a semiconductor layer, and an optical waveguide spaced apart from the semiconductor layer and evanescently coupled with a depletion region of the photodiode.

Another embodiment in this disclosure is an apparatus comprising a lateral photodiode disposed on a semiconductor layer, and an optical waveguide spaced apart from the lateral photodiode and top-coupled with a depletion region of the lateral photodiode.

Another embodiment in this disclosure is an apparatus comprising a vertical photodiode disposed on a semiconductor layer, and an optical waveguide spaced apart from the vertical photodiode and side-coupled with a depletion region of the vertical photodiode.

Example Embodiments

Embodiments of the present disclosure describe a photonic device that includes a photodetector (e.g., a semiconductor-based photodiode) coupled to one or more optical waveguides. In some embodiments, the semiconductor-based photodiode is disposed on a semiconductor layer (such as a SOI layer), and the photodiode is formed of semiconductor material(s) different than that of the semiconductor layer. For example, the semiconductor layer may be formed of crystalline silicon (e.g., a SOI layer), and the photodiode is formed of germanium, indium gallium arsenide (InGaAs), and so forth. Unlike silicon, germanium is an efficient photodetector material at wavelengths of optical signals that are typically used for optical data communication. Moreover, because single crystal germanium and single crystal silicon have closely matched lattice constants, single crystal germanium can be grown on crystalline silicon. In one embodiment, germanium is coupled to at least one optical waveguide that is not formed using the SOI layer, to form an optical detector.

While an optical waveguide can extend directly beneath the germanium to transfer the optical signal propagating through the optical waveguide into the germanium, doing so results in most of the optical signal being absorbed at an entrance facet of the germanium. However, the entrance facet of the germanium may have defects which contribute to dark current appearing in the resulting electrical signal. Further, the electrical field that is used to convert the optical signal into the electrical signal may be relatively weak at the entrance facet of the germanium. The absorption of light in the entrance facet with low electric fields typically results in an intensity-dependent reduction of speed or bandwidth of the optical detector.

Instead of directly coupling the optical waveguide to the germanium, in some embodiments, the optical waveguide is spaced apart from the germanium and light is coupled evanescently from the optical waveguide to the germanium in a controlled manner. In some embodiments, the optical waveguide is either top-coupled or side-coupled to the germanium. By changing the shape of the optical waveguide, changing the distance between the optical waveguide and the germanium, using multiple coupled optical waveguides (which may have different dimensioning), the interaction of the optical mode with the specific regions of the optical detector can be engineered. Doing so enables light to be absorbed only in the desired region(s) of the germanium detector in a controlled manner (e.g., in the high field region of the optical detector). This method avoids or minimizes absorption in the low field region and hence mitigating the intensity-dependent loss of bandwidth. As a result, the photonic device may be capable of supporting greater bandwidths (e.g., 60 gigahertz (GHz) or greater) at higher intensities of the optical signal.

FIG. 1 is a block diagram of an exemplary apparatus 100, according to one or more embodiments. The apparatus 100 comprises an optical detector 135 that is optically coupled with an optical device 120.

The optical detector 135 comprises a photodiode 105 that is disposed on a semiconductor layer 130. In some embodiments, the semiconductor layer 130 comprises a SOI layer (e.g., a silicon layer arranged above an oxide layer), although other types of semiconductor material(s) are also contemplated.

In some embodiments, the photodiode 105 is disposed on a surface of the semiconductor layer 130 (e.g., the photodiode 105 directly contacts a top surface of the semiconductor layer 130). In some embodiments, some or all of the photodiode 105 extends into a recess formed from a surface of the semiconductor layer 130. In other embodiments, the photodiode 105 may be arranged above the semiconductor layer 130.

Each of the photodiode 105 and the semiconductor layer 130 is formed of one or more semiconductor materials. In some embodiments, the semiconductor layer 130 comprises silicon, and the photodiode 105 comprises a germanium photodiode, although other combinations of semiconductor materials are also contemplated. In one example, the semiconductor layer 130 comprises silicon, and the photodiode 105 is formed partly from silicon of the semiconductor layer 130 and partly from germanium.

The photodiode 105 may be implemented as a p-n photodiode having differently-doped regions arranged in a contacting relationship, or as a p-i-n photodiode having an undoped intrinsic region arranged between the differently-doped regions. The photodiode 105 may be implemented as a lateral photodiode having the different regions (e.g., the differently-doped regions and/or the undoped intrinsic region) arranged laterally, or as a vertical photodiode having the different regions arranged vertically.

The apparatus 100 further comprises one or more optical waveguides 115 that are evanescently coupled with a depletion region 110 of the photodiode 105. In some embodiments, the depletion region 110 (which, in some cases, may be formed at least in the intrinsic region of the photodiode 105) extends along a first dimension, and at least a portion of the optical waveguide 115 extends parallel to the depletion region 110 along the first dimension.

In some embodiments, the optical waveguide 115 is formed of silicon nitride or silicon oxynitride, but other suitable materials are contemplated (e.g., having suitable propagation characteristics at wavelengths used for optical communication, compatible with complementary metal-oxide-semiconductor fabrication processes used to form the apparatus 100, and so forth). The optical waveguide 115 may be positioned with a predefined spacing relative to the semiconductor layer 130 and/or to the photodiode 105. For example, the optical waveguide 115 may be formed at a predefined height relative to the top surface of the semiconductor layer 130, e.g., spaced apart from the semiconductor layer 130, with the height being controlled by the thickness of one or more dielectric layers (e.g., oxide layers). The dimensioning of the optical waveguide 115 may be changed to control the interaction of the optical mode of the optical waveguide 115 with specific regions of the photodiode 105. The optical waveguide 115 may also be composed of multiple layers of waveguide layers.

The optical device 120 is external to the optical detector 135 and may have any suitable implementation for communicating optical signals with the optical waveguide 115. In some embodiments, the optical device 120 comprises an optical fiber. In other embodiments, the optical device 120 may comprise an optical waveguide formed in a same layer as the optical waveguide 115, an optical waveguide formed in the semiconductor layer 130, or an optical waveguide of photonic circuitry external to the optical detector 135. The photonic circuitry may be formed in the same semiconductor layer 130 as the optical detector 135, or in separate wave-guiding layer(s). Active and/or passive optical alignment techniques, which are not discussed in detail here but are known to the person of ordinary skill in the art, may be used to optically align the optical device 120 and the optical waveguide 115. The optical device 120 is configured to transmit an optical signal 125 that is propagated by the optical waveguide 115 and evanescently coupled into the depletion region 110 of the photodiode 105.

Figure 2:
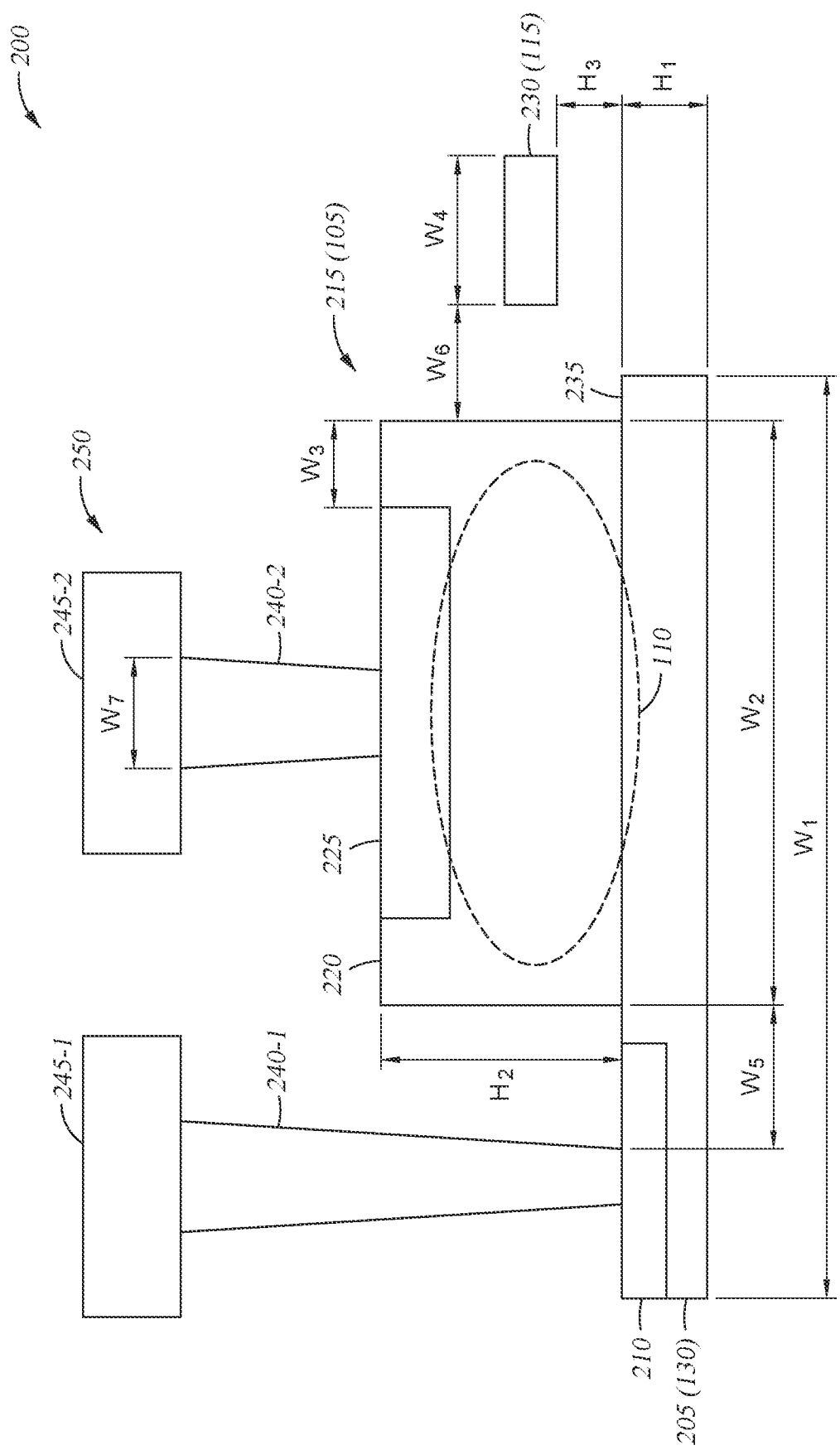
FIG. 2 is a cross-sectional diagram of an exemplary optical detector having a vertical photodiode that is side coupled with an optical waveguide, according to one or more embodiments.

FIG. 2 is a diagram 200 of an exemplary optical detector having a vertical photodiode 215, according to one or more embodiments. More specifically, the diagram 200 provides a cross-sectional view of the optical detector. The features illustrated in the diagram 200 may be used in conjunction with other embodiments, e.g., representing one possible implementation of the optical detector 135 of FIG. 1.

In the diagram 200, a block 220 of germanium is disposed on, and directly contacts, a SOI layer 205 (one example of the semiconductor layer 130 of FIG. 1). Other suitable semiconductor materials are also contemplated for the block 220 and the SOI layer 205. The block 220 may be formed using any suitable techniques, e.g., epitaxially growing germanium onto a top surface 235 of the SOI layer 205 in selected regions using selective area epitaxy, and in some cases selectively etching or polishing the germanium to control the dimensions of the block 220. As shown, the SOI layer 205 has a height $h_1$ and a width $w_1$, and the block 220 has a height $h_2$ and a width $w_2$. In some embodiments, the height $h_1$ is between about 0.05 microns and 0.25 microns, and the width $w_1$ is between about 5 microns and 10 microns, although other ranges are also contemplated. In some embodiments, the height $h_2$ is between about 0.5 microns and 1.5 microns, and the width $w_2$ is between about 0.25 microns and 10 microns, although other ranges are also contemplated.

Within the vertical photodiode 215, an electrical contact 225 is created by doping the top of the block 220 of germanium with a first conductivity type (e.g., n-type or p-type). The electrical contact 225 is shown as extending to a top surface of the block 220, which is opposite a bottom surface of the block 220 that contacts the top surface 235 of the SOI layer 205. The electrical contact 225 is inset from a lateral extent of the block 220 by a width $w_3$, which in some embodiments may be between about 0.2 microns and 1.5 microns.

The electrical contact 225 is more heavily doped than the bulk of the block 220. In some embodiments, the bulk of the block 220 is undoped and represents an intrinsic region of a p-i-n implementation of the photodiode 105. Although the depletion region 110 is shown as being formed partly in the intrinsic region, in alternate embodiments the depletion region 110 may be formed around the p-n junction of a p-n photodiode (e.g., with no intrinsic region).

In other embodiments, the bulk of the block 220 is doped with the first conductivity type, and is more lightly doped than the electrical contact 225. Further, in cases where the bulk of the block 220 is doped, the bulk of the block 220 may be doped with a single doping level or with multiple doping levels. For example, the dopant concentration may be increased in a step-wise or a substantially continuous manner as the distance from the depletion region 110 and/or the optical waveguide 115 increases.

An electrical contact 210 of the SOI layer 205 is doped with a second, different conductivity type that is different than the first conductivity type of the electrical contact 225 (e.g., p-type or n-type). The electrical contact 210 is shown as extending to the top surface 235 of the silicon substrate. For illustration, the electrical contact 210 is positioned laterally outward from the lateral extent of the block 220. However, arranging the electrical contact 210 in any peripheral region surrounding the block 220 is also contemplated. The electrical contact 210 is more heavily doped than the bulk of the SOI layer 205. In some embodiments, the bulk of the SOI layer 205 is more lightly doped than the electrical contact 210. The bulk of the SOI layer 205 may be doped with a single doping level or with multiple doping levels. For example, the dopant concentration may be increased in a step-wise or a substantially continuous manner as the distance from the depletion region 110 and/or the optical waveguide 115 increases. In other embodiments, the bulk of the SOI layer 205 is undoped.

Thus, in one exemplary implementation, the vertical photodiode 215 is a p-i-n photodiode in which the SOI layer 205 (including the electrical contact 210) is doped p-type, the bulk of the block 220 of germanium is an undoped intrinsic region, and the electrical contact 225 of the block 220 is doped n-type. However, for all the embodiments where dopant type(s) are specified, the dopant types may be reversed—e.g., the SOI layer 205 may be doped n-type while the electrical contact 225 is doped p-type.

In the diagram 200, a silicon nitride waveguide 230 (one example of the optical waveguide 115 of FIG. 1) is spaced apart from the block 220. Other suitable materials are also contemplated for the optical waveguide 115. The silicon nitride waveguide 230 has a width $w_4$, is spaced apart from a lateral extent of the block 220 by a width $w_6$, and has a height $h_3$ relative to the top surface 235. In some embodiments, the width $w_4$ is between about 0.5 microns and 1.5 microns, although other ranges are contemplated. Further, the width $w_4$ may remain constant along the length of the silicon nitride waveguide 230, or may be varied (e.g., tapered) along the length of the silicon nitride waveguide 230. In some embodiments, the width $w_6$ is between about 0.5 microns and 2 microns, and the height $h_3$ is between about 0.2 microns and 0.8 microns, although other ranges are contemplated.

In some embodiments, some or all of the widths $w_2$, $w_3$, $w_4$, $w_6$ and the heights $h_2$, $h_3$ are controlled such that the silicon nitride waveguide 230 is evanescently coupled with the depletion region 110 of the vertical photodiode 215.

In the diagram 200, electrical contacts 245-1, 245-2 are formed in a single layer 250 (e.g., a metal layer) above the vertical photodiode 215. A via 240-1 electrically couples the electrical contact 245-1 to the electrical contact 210, and a via 240-2 electrically couples the electrical contact 245-2 to the electrical contact 225. In some embodiments, the electrical contacts 245-1, 245-2 and/or the vias 240-1, 240-2 are metallic or formed from silicide. The electrical contacts 245-1, 245-2 and the vias 240-1, 240-2 may have any suitable dimensions. For example, the via 240-2 may have a width $w_7$ near the electrical contact 245-2, which in some embodiments may be between about 1 micron and 10 microns.

Because the presence of electrically conductive materials may have an undesired effect on the performance of the optical detector, the electrical contacts 245-1, 245-2 and the vias 240-1, 240-2 may be arranged away from the depletion region 110 and/or the silicon nitride waveguide 230. For example, the via 240-2 may extend in a vertical direction away from the vertical photodiode 215, and the via 240-1 may be positioned away from the lateral extent of the block 220 by a width $w_5$. In some embodiments, the width $w_5$ is between 0.5 microns and 2 microns, although other ranges are also contemplated. Further, the via 240-1 is arranged on one side of the block 220, and the silicon nitride waveguide 230 is arranged on an opposite side.

Figure 3:
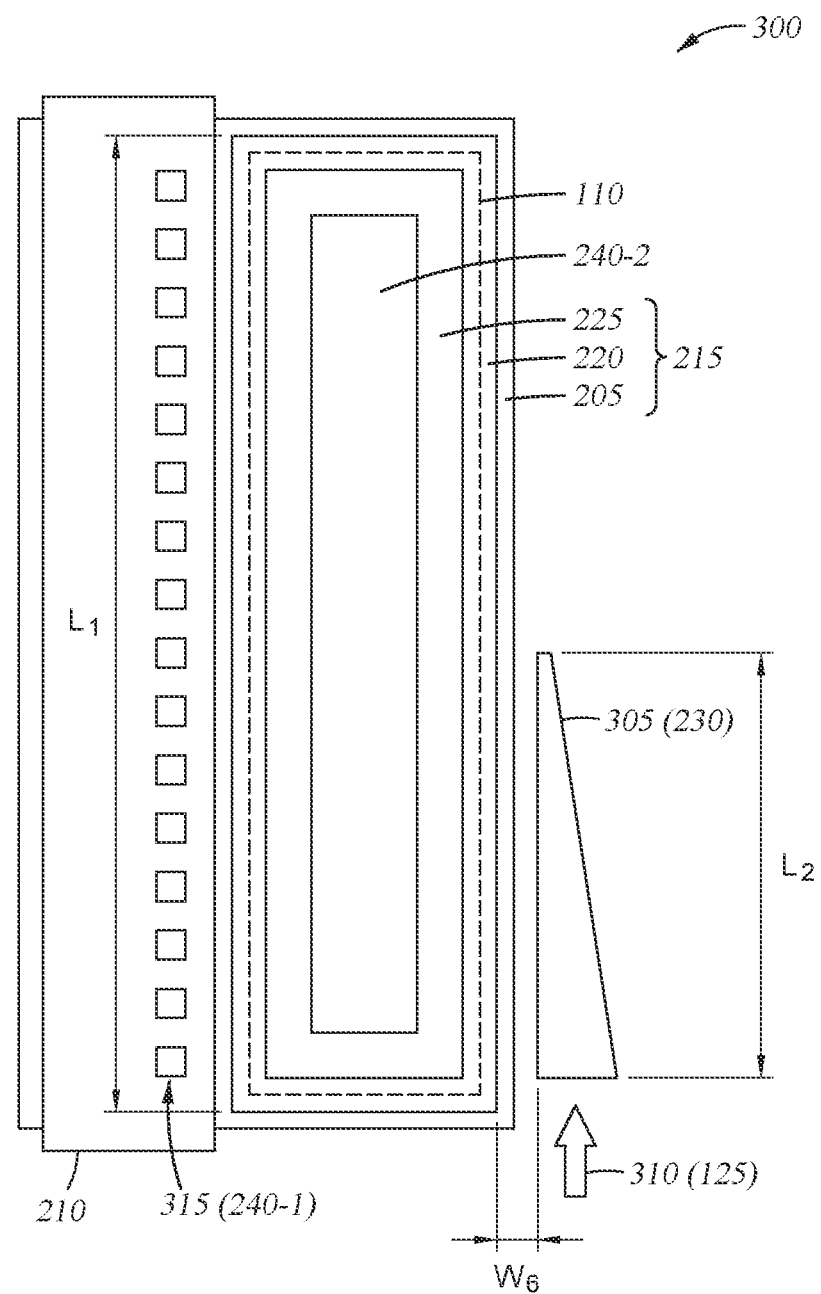
FIGS. 3 and 4 are top view diagrams illustrating exemplary implementations of an optical detector having a vertical photodiode that is side coupled-with an optical waveguide, according to one or more embodiments.
Figure 4:
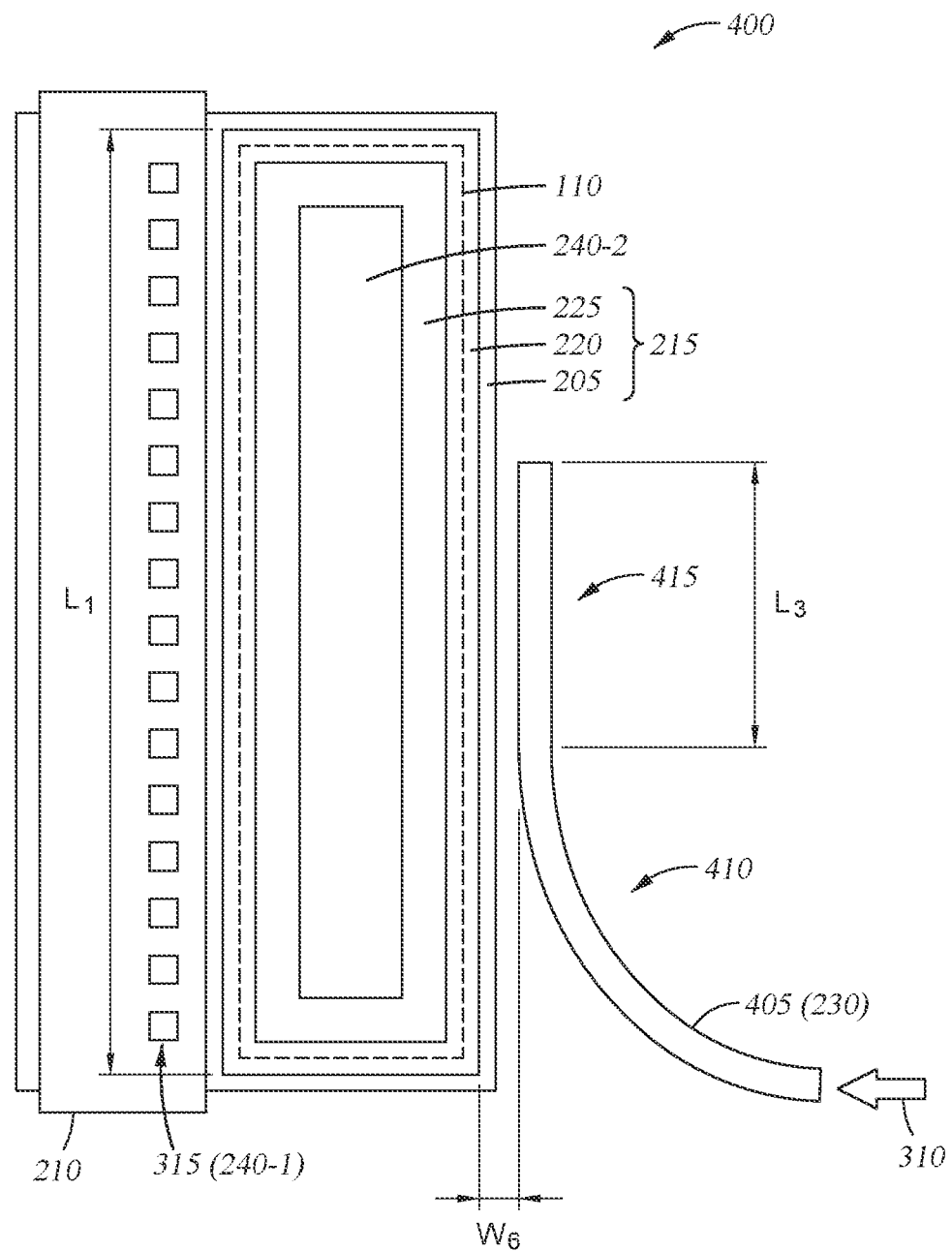

FIGS. 3 and 4 are diagrams 300, 400 illustrating exemplary implementations of an optical detector having a vertical photodiode coupled with an optical waveguide, according to one or more embodiments. More specifically, the diagrams 300, 400 provide a top view of different implementations of the optical detector depicted in the diagram 200 of FIG. 2.

In the diagram 300, the block 220 extends with a length $l_1$ along a first dimension (which corresponds to into/out of the page in the diagram 200). As a result, the depletion region 110 (which, in some cases, is included in an intrinsic region of the block 220) of the vertical photodiode 215 also extends along the first dimension.

The electrical contact 245-2 extends parallel to the block 220 along the first dimension. At least a portion of a tapered optical waveguide 305 (representing one example of the silicon nitride waveguide 230) extends with a length $l_2$ along the first dimension, parallel to the intrinsic region. The tapered optical waveguide 305 receives an optical signal 310 at the non-tapered end, which is evanescently coupled into the depletion region 110. The tapered optical waveguide 305 tapers as it extends along the first dimension, which improves the coupling of the optical signal 310 into the depletion region 110.

In the diagram 300, a plurality of vias 315 (representing one example of the via 240-1) are coupled with the electrical contact 210. Generally, using the plurality of vias 315 tends to reduce a resistance of the vertical photodiode, which increases an RC bandwidth. The plurality of vias 315 are arranged in a line extending along the first dimension. A single via 240-2 is coupled with the electrical contact 225.

In the diagram 400, at least a portion of a curved optical waveguide 405 (representing another example of the silicon nitride waveguide 230) extends along the first dimension, parallel to an extent of the vertical photodiode 215 (or an extent of the intrinsic region). As shown, the curved optical waveguide 405 receives the optical signal at a curved waveguide section 410, and propagates the optical signal 310 through the curved waveguide section 410 to a straight or tapered waveguide section 415. The waveguide section 415 extends with a length $l_3$ along the first dimension, parallel to an extent of the vertical photodiode 215.

Using the tapered optical waveguide 305 or the curved optical waveguide 405, the optical signal 310 may be coupled into the depletion region 110 away from the endface of the block 220 in a gradual manner. Generally, in situations when an optical waveguide is butt-coupled to a vertical photodiode 215, a significant amount of an optical signal is absorbed in a region where the electric field is weak. Additionally, the light absorption by the germanium is not uniformly distributed at the edge of the optical detector, which generates a greater number of electron-hole pairs near the interface. The electric field generated by the excess photocarriers tends to screen the depletion region, which reduces the bandwidth of the optical detector especially when the intensity of the optical signal 310 is high.

By using the tapered optical waveguide 305 or the curved optical waveguide 405 to evanescently couple the optical signal 310 into the depletion region 110, the optical detector may have a greater bandwidth. For example, the optical detector may support bandwidths of 60 GHz or greater at higher intensities of the optical signal, as the optical detector is less sensitive to intensity-dependent decreases in bandwidth.

Figure 5:
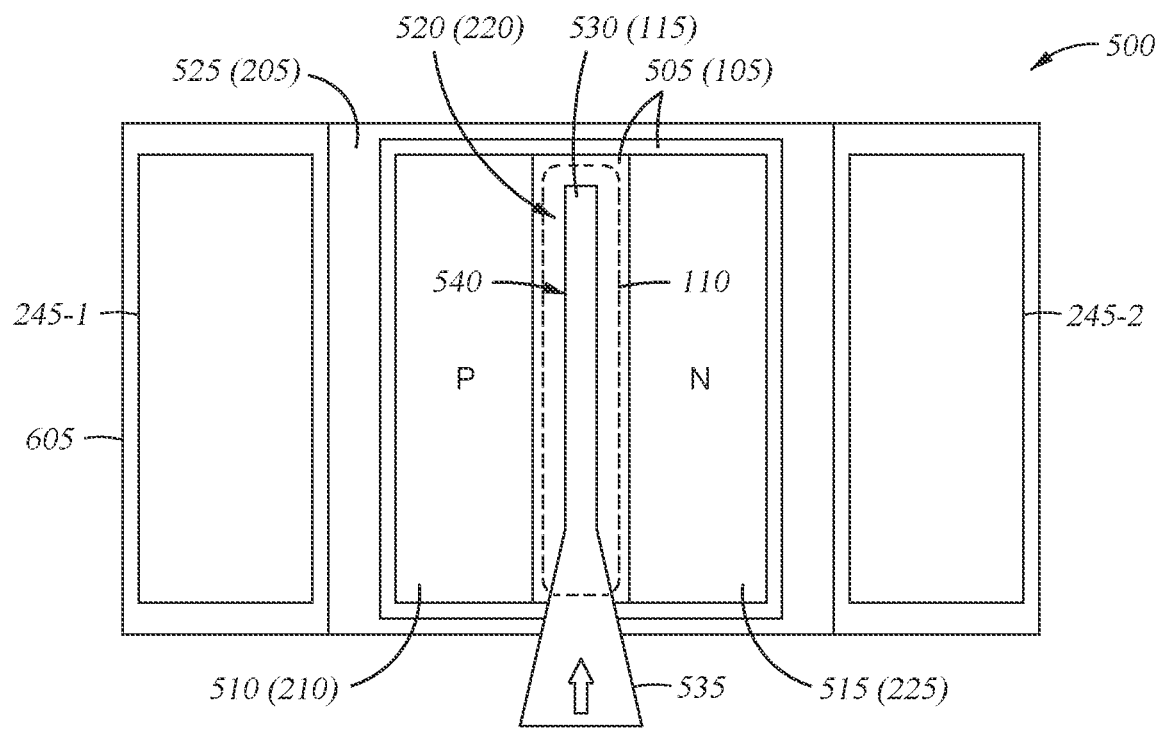
FIG. 5 is a top view diagram illustrating an exemplary implementation of an optical detector having a lateral photodiode that is top coupled with a tapered optical waveguide, according to one or more embodiments.
Figure 6:
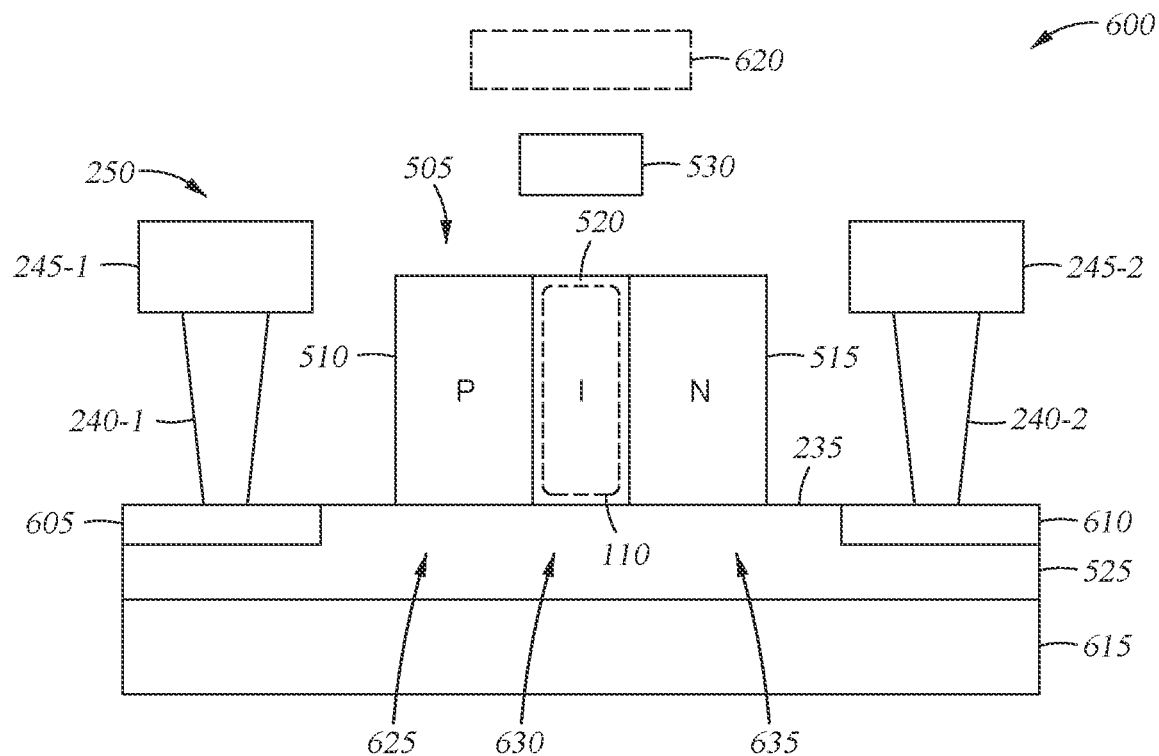
FIG. 6 is a cross-sectional diagram illustrating an exemplary implementation of an optical detector having a lateral photodiode that is top coupled with an optical waveguide, according to one or more embodiments.

FIGS. 5 and 6 are diagrams 500, 600 illustrating an exemplary implementation of an optical detector having a lateral photodiode 505 coupled with a tapered optical waveguide 530, according to one or more embodiments. More specifically, the diagram 500 provides a top view of the optical detector, and the diagram 600 provides a cross-sectional view of the optical detector. The features illustrated in the diagrams 500, 600 may be used in conjunction with other embodiments, e.g., representing one possible implementation of the optical detector 135 of FIG. 1.

In the diagram 500, the lateral photodiode 505 is disposed on (here, directly contacting) a top surface 235 of a SOI layer 525 (representing one example of the SOI layer 205). The SOI layer 525 is disposed above an insulating layer 615 (e.g., an oxide layer). Electrical contacts 605, 610 having relatively heavy doping are formed on opposing ends of the SOI layer 525.

In some embodiments, the lateral photodiode 505 is formed of germanium, although other semiconductor materials are also contemplated. The lateral photodiode 505 comprises a first region 510 doped with a first conductivity type (as shown, p-type) and a second region 515 doped with a second, different conductivity type (as shown, n-type). An undoped intrinsic region 520 of the lateral photodiode 505 is arranged between the first region 510 and the second region 515. Although the lateral photodiode 505 is illustrated as a p-i-n photodiode, in other embodiments the lateral photodiode 505 is a p-n photodiode (e.g., with the first region 510 and the second region 515 directly contacting each other).

In some embodiments, the SOI layer 525 has a doping profile similar to that of the lateral photodiode 505. For example, the SOI layer 525 comprises a first region 625 arranged beneath the first region 510 of the lateral photodiode 505 and doped with the first conductivity type, and a second region 635 arranged beneath the second region 515 of the lateral photodiode 505 and doped with the second conductivity type. The electrical contact 605 is more heavily doped with the first conductivity type than the first region 625, the electrical contact 610 is more heavily doped with the second conductivity type than the second region 635. As shown, the SOI layer 525 further comprises an intrinsic region 630 arranged beneath the intrinsic region 520 of the lateral photodiode 505. The doping profile of the SOI layer 525 may be increased in a step-wise or a substantially continuous manner.

In the lateral photodiode 505, the depletion region 110 (as well as the intrinsic region 520) extends along a first dimension (the vertical direction as shown in FIG. 5), and the tapered optical waveguide 530 extends parallel to the depletion region 110 in the first dimension. In this way, the tapered optical waveguide 530 is spaced apart from the lateral photodiode 505 and top-coupled with the depletion region 110. The tapered optical waveguide 530 may be formed of any suitable material(s), such as silicon nitride. The tapered optical waveguide 530 receives the optical signal at a relatively wide portion of a tapered section 535, and propagates the optical signal through a narrow portion of the tapered section 535 into a straight waveguide section 540.

Beneficially, evanescently coupling the optical signal from the tapered optical waveguide 530 into the depletion region 110 can be controlled and light may absorbed along the length of the lateral photodiode 505 in a gradual manner. Further, the width (tapering) of the tapered optical waveguide 530 can be controlled to allow absorption of the optical signal by the lateral photodiode 505 to occur only in the depletion region 110.

Further, in some embodiments, the optical detector further comprises a second optical waveguide 620 that is evanescently coupled with the tapered optical waveguide 530. As shown in the diagram 600, the tapered optical waveguide 530 is arranged above the depletion region 110, and the second optical waveguide 620 is arranged above the tapered optical waveguide 530. While the second optical waveguide 620 is depicted in conjunction with the lateral photodiode 505, other implementations of the optical detector (e.g., using the vertical photodiode 215 of FIGS. 2-4) may be modified to include multiple optical waveguides.

The second optical waveguide 620 may be formed of any suitable material(s), such as silicon nitride. The positioning and/or dimensioning of the tapered optical waveguide 530 and the second optical waveguide 620 may be controlled to further optimize placement of the optical mode in the depletion region 110. In some cases, the width of the intrinsic region 520 may be independent of the width of the tapered optical waveguide 530 and/or the second optical waveguide 620. A height of the tapered optical waveguide 530 relative to the top of the lateral photodiode 505 may be controlled to optimize placement of the optical mode.

Figure 7:
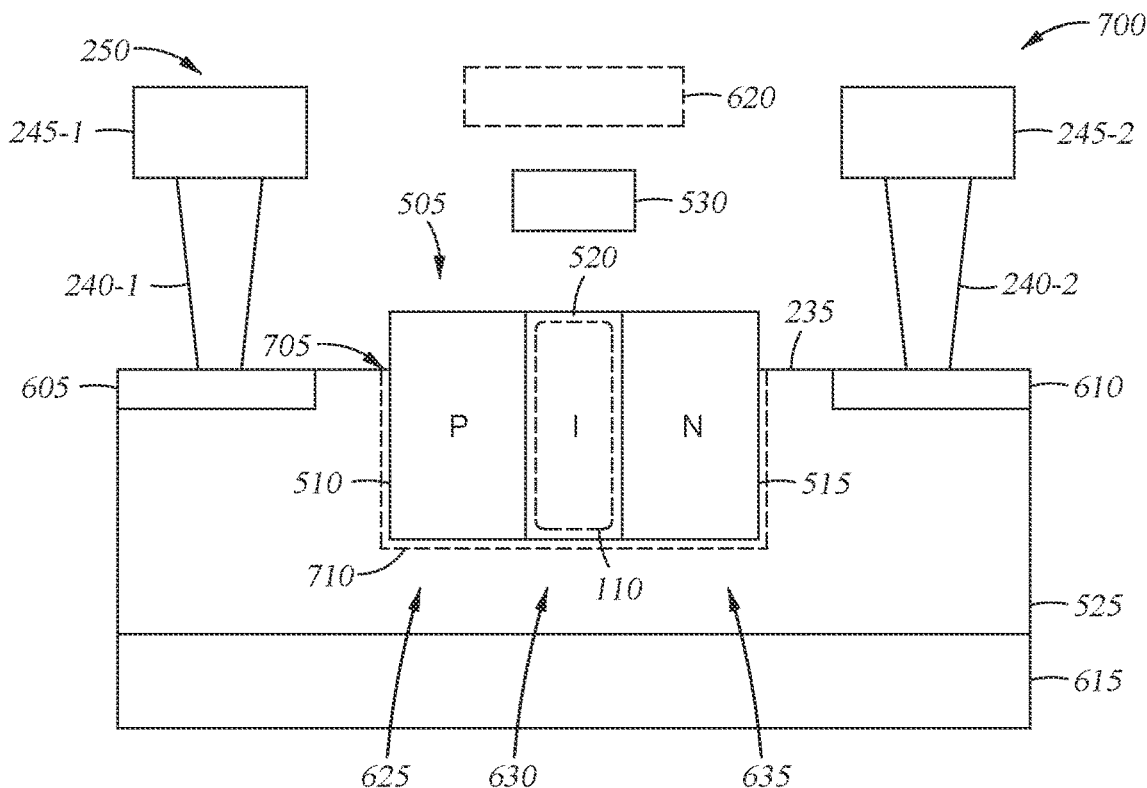
FIG. 7 is a cross-sectional diagram illustrating an exemplary implementation of an optical detector having a lateral photodiode extending into a recess formed into a semiconductor layer, according to one or more embodiments.

FIG. 7 is a diagram 700 illustrating an exemplary implementation of an optical detector having a lateral photodiode 505 extending into a recess 705 formed the SOI layer 525, according to one or more embodiments. The features illustrated in the diagram 700 may be used in conjunction with other embodiments, e.g., representing one possible implementation of the optical detector 135 of FIG. 1.

In the diagram 700, a recess 705 is formed from the top surface 235 of the SOI layer 525 to a recessed surface 710, which in some cases is planar and/or parallel to the top surface 235. In some embodiments, the recess 705 is formed through a suitable silicon etching process. The lateral photodiode 505 is formed, e.g., by epitaxially growing germanium into the recess 705. Thus, the first region 510, the second region 515, and the intrinsic region 520 of the lateral photodiode 505 extends into the recess 705. In some cases, and as shown, part of the lateral photodiode 505 extends out of the recess 705 (e.g., to a height above the top surface 235). In other cases, however, the lateral photodiode 505 may be disposed entirely within the recess 705.

Figure 8:
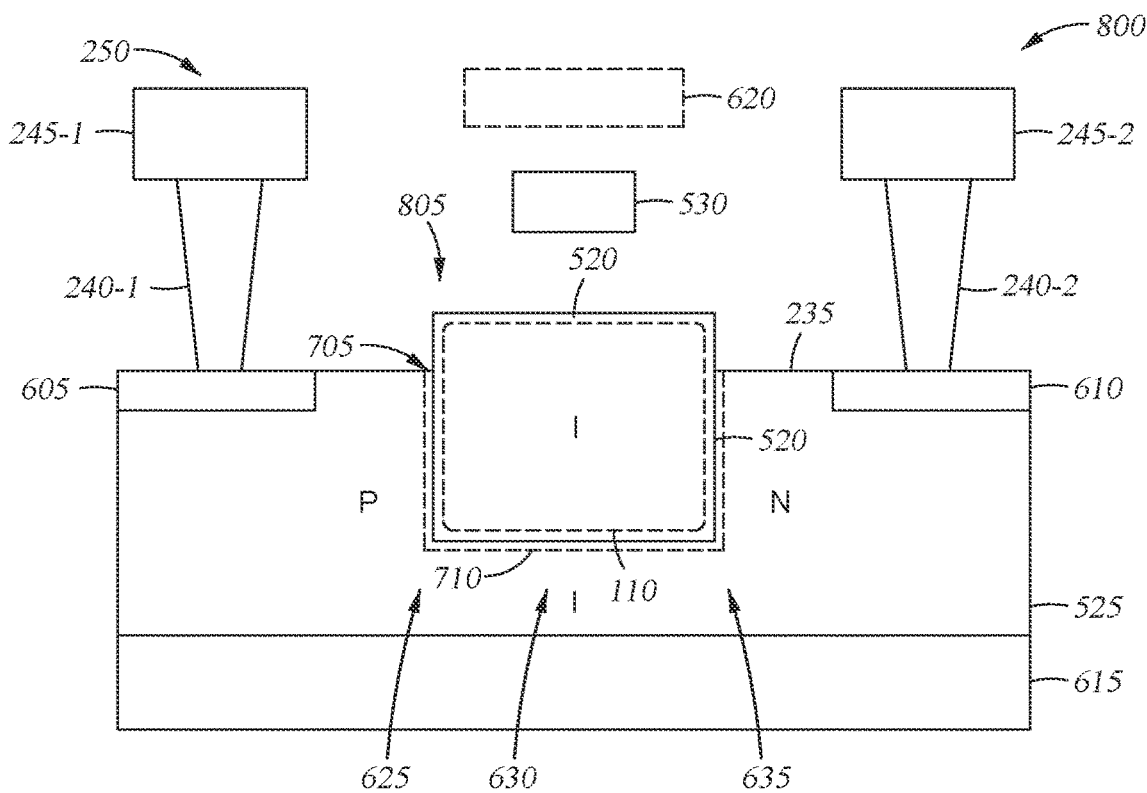
FIG. 8 is a cross-sectional diagram illustrating an exemplary implementation of an optical detector with an intrinsic region of a lateral photodiode extending into a recess formed into semiconductor layer, according to one or more embodiments.

FIG. 8 is a diagram 800 illustrating an exemplary implementation of an optical detector with an intrinsic region of a lateral photodiode 805 extending into a recess formed into a substrate, according to one or more embodiments. The features illustrated in the diagram 800 may be used in conjunction with other embodiments, e.g., representing one possible implementation of the optical detector 135 of FIG. 1.

As with the diagram 700, germanium may be deposited into the recess 705. However, the germanium remains undoped in the diagram 800. In this way, the first region 625 of the SOI layer 525 forms the p-type region of the lateral photodiode 805, and the second region 635 of the SOI layer 525 forms the n-type region of the lateral photodiode 805. The intrinsic region of the lateral photodiode 805 is formed by the intrinsic region 520 and the intrinsic region 630 of the SOI layer 525.

Figure 9:
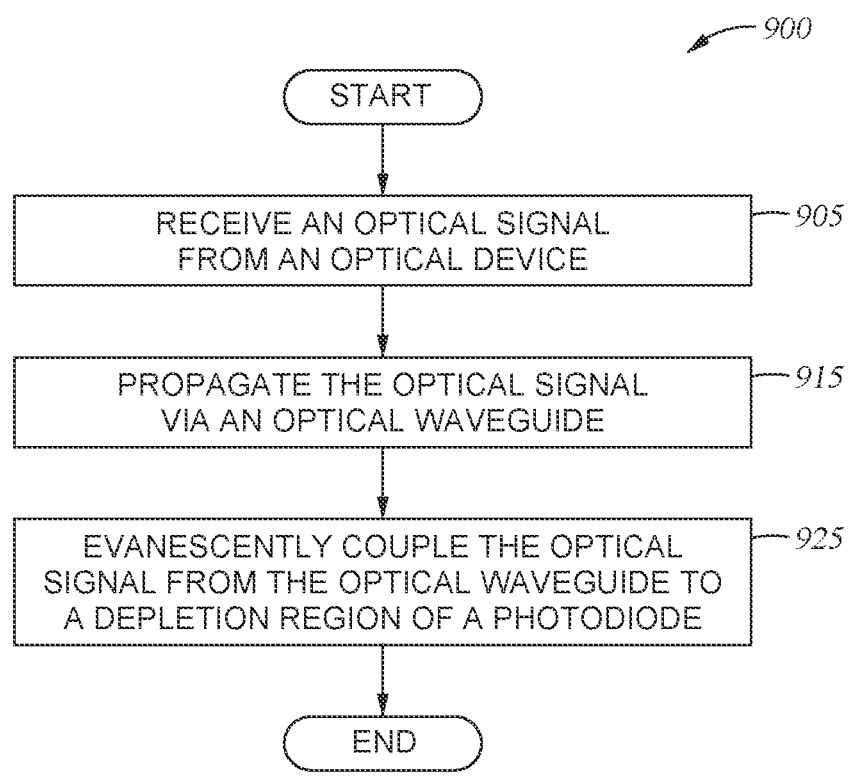
FIG. 9 is a method of operating an exemplary apparatus, according to one or more embodiments.

FIG. 9 is a method 900 of operating an exemplary apparatus, according to one or more embodiments. The method 900 may be performed in conjunction with other embodiments, e.g., using one of the implementations of the optical detector depicted in FIGS. 2-8.

The method 900 begins at block 905, where an optical signal is received from an optical device. The optical device may be external to the optical detector. In some embodiments, the optical device comprises an optical fiber or an optical waveguide of photonic circuitry external to the optical detector. At block 915, the optical signal is propagated via an optical waveguide of the optical detector. The optical waveguide of the optical detector is spaced apart from the semiconductor layer on which a photodiode of the optical detector is disposed.

At block 925, the optical signal is evanescently coupled from the optical waveguide to a depletion region of a photodiode. In some embodiments, the optical waveguide is top-coupled or side-coupled with the photodiode. In some embodiments, the depletion region is formed partly in an intrinsic region of the photodiode. The method 900 ends following completion of block 925.

Figure 10:
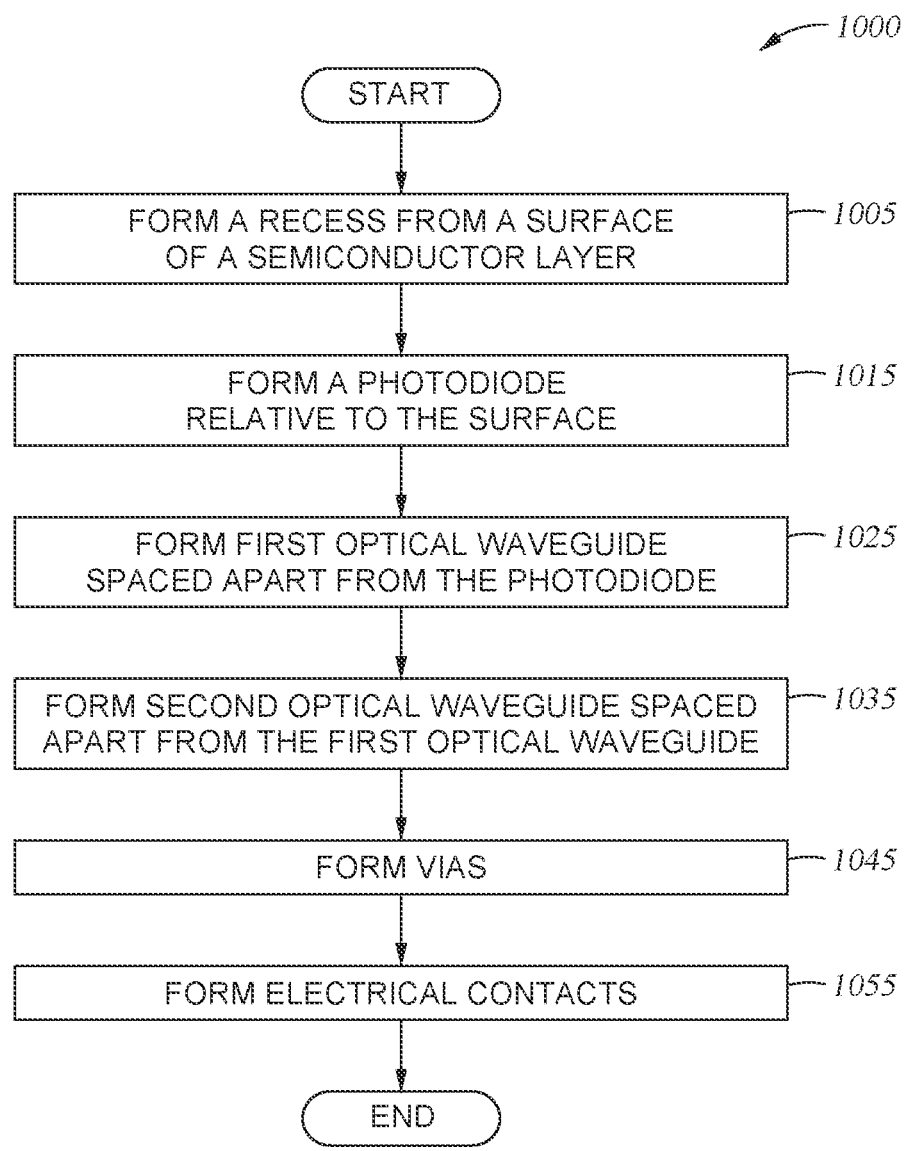
FIG. 10 is a method of constructing an exemplary apparatus, according to one or more embodiments.

FIG. 10 is a method 1000 of constructing an exemplary apparatus, according to one or more embodiments. The method 1000 may be performed in conjunction with other embodiments, e.g., to form one of the implementations of the optical detector depicted in FIGS. 2-8.

The method 1000 begins at an optional block 1005, where a recess is formed from a surface of a semiconductor layer. In some embodiments, the semiconductor layer comprises a silicon layer (e.g., a Sal layer) and the recess is formed using a suitable etching process.

At block 1015, a photodiode is formed relative to the surface of the semiconductor layer. In some embodiments, the photodiode is formed at least partly in the recess. In other embodiments, the photodiode is formed on the surface. In cases where the semiconductor layer comprises a silicon layer, the photodiode may be formed using germanium epitaxially grown on the silicon layer.

At block 1025, a first optical waveguide is formed that is spaced apart from the photodiode. The first optical waveguide is also spaced apart from the semiconductor layer. In some embodiments, the first optical waveguide is arranged above a lateral photodiode, such that the first optical waveguide is top-coupled with a depletion region of the lateral photodiode. In other embodiments, the first optical waveguide is arranged above a vertical photodiode, such that the first optical waveguide is side-coupled with a depletion region of the vertical photodiode. In some embodiments, the first optical waveguide is formed of silicon nitride.

At optional block 1035, a second optical waveguide is formed that is spaced apart from the first optical waveguide. The positioning and/or dimensioning of the first optical waveguide and the second optical waveguide may be controlled to optimize a placement of the optical mode in the depletion region of the photodiode.

At block 1045, vias are formed that couple to the photodiode. In some embodiments, the vias extend to electrical contacts formed in the semiconductor layer, which are more heavily doped than the rest of the semiconductor layer. The vias may be arranged away from the optical waveguide to reduce any optical losses that might be caused by the conductive material. For example, the optical waveguide may be disposed to one side of the photodiode, and the vias may be disposed on other, different sides of the photodiode. At block 1055, electrical contacts are formed that are coupled to the vias. In some embodiments, the electrical contacts are formed in a metal layer. The method 1000 ends following completion of block 1055.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. An apparatus comprising:
a lateral photodiode disposed on a semiconductor layer, wherein the lateral photodiode comprises a first region doped with a first conductivity type, a second region doped with a second conductivity type opposite the first conductivity type, and a first intrinsic region positioned between the first region and the second region, wherein a depletion region of the lateral photodiode is positioned within the first intrinsic region; and
an optical waveguide spaced apart from the lateral photodiode and top-coupled with the depletion region of the lateral photodiode, wherein the optical waveguide comprises a straight waveguide section that extends parallel to the depletion region and a tapered section, wherein the tapered section comprises (i) a first portion coupled to the straight waveguide section and (ii) a second portion configured to receive an optical signal, wherein the second portion is wider than the first portion, wherein the first portion is positioned between the second portion and the straight waveguide section, and wherein the lateral photodiode is positioned between the semiconductor layer and the optical waveguide.

2. The apparatus of claim 1, wherein the lateral photodiode is disposed on a surface of the semiconductor layer.

3. The apparatus of claim 1, wherein the first intrinsic region extends into a recess formed from a surface of the semiconductor layer.

4. The apparatus of claim 3, wherein one or both of a p-type region and an n-type region of the lateral photodiode extends into the recess.

5. The apparatus of claim 1, wherein the optical waveguide is a first optical waveguide, the apparatus further comprising:
a second optical waveguide evanescently coupled with the first optical waveguide.

6. The apparatus of claim 5, wherein the second optical waveguide is arranged above the first optical waveguide.

7. The apparatus of claim 1, wherein the semiconductor layer comprises a third region arranged beneath the first region of the lateral photodiode and doped with the first conductivity type, and a fourth region arranged beneath the second region of the lateral photodiode and doped with the second conductivity type.

8. The apparatus of claim 7, wherein the semiconductor layer comprises a second intrinsic region arranged beneath the first intrinsic region.

9. The apparatus of claim 1,
wherein the lateral photodiode is formed of germanium, and
wherein the semiconductor layer is formed of silicon.

10. The apparatus of claim 9, wherein the semiconductor layer comprises a silicon-on-insulator (SOI) layer.

11. An apparatus comprising:
a semiconductor layer defining a recess from a top surface;
a lateral photodiode comprising:
a first region doped with a first conductivity type;
a second region doped with a second, different conductivity type; and
an intrinsic region extending into the recess; and
an optical waveguide spaced apart from the lateral photodiode and top-coupled with a depletion region of the lateral photodiode, wherein the optical waveguide comprises a straight waveguide section that extends parallel to the depletion region and a tapered section, wherein the tapered section comprises (i) a first portion coupled to the straight waveguide section and (ii) a second portion configured to receive an optical signal, wherein the second portion is wider than the first portion, wherein the first portion is positioned between the second portion and the straight waveguide section, and wherein the lateral photodiode is positioned between the semiconductor layer and the optical waveguide.

12. The apparatus of claim 11, wherein the first region and the second region extend into the recess.

13. The apparatus of claim 11, wherein the first region and the second region are formed in the semiconductor layer.

14. The apparatus of claim 11,
wherein the semiconductor layer comprises a third region arranged beneath the first region of the lateral photodiode and doped with the first conductivity type, and a fourth region arranged beneath the second region of the lateral photodiode and doped with the second conductivity type, and
wherein the semiconductor layer comprises a second intrinsic region arranged beneath the intrinsic region of the lateral photodiode.

15. The apparatus of claim 11,
wherein the intrinsic region is formed of germanium, and
wherein the semiconductor layer is formed of silicon.

16. The apparatus of claim 15, wherein the semiconductor layer comprises a silicon-on-insulator (SOI) layer.

17. The apparatus of claim 11, wherein the optical waveguide is a first optical waveguide, the apparatus further comprising:
a second optical waveguide evanescently coupled with the first optical waveguide.

18. The apparatus of claim 17, wherein the second optical waveguide is arranged above the first optical waveguide.

* * * * *